United States Patent [19]

Okumura et al.

[11] Patent Number: 5,281,838
[45] Date of Patent: Jan. 25, 1994

[54] SEMICONDUCTOR DEVICE HAVING CONTACT BETWEEN WIRING LAYER AND IMPURITY REGION

[75] Inventors: Yoshinori Okumura; Atsushi Hachisuka, both of Hyogo, Japan

[73] Assignee: Mitsubishi Denki Kabushiki Kaisha, Tokyo, Japan

[21] Appl. No.: 899,021

[22] Filed: Jun. 15, 1992

Related U.S. Application Data

[63] Continuation of Ser. No. 662,000, Mar. 1, 1991, abandoned.

[30] Foreign Application Priority Data

Mar. 13, 1990 [JP] Japan .................... 2-63671

[51] Int. Cl.$^5$ .................. H01L 23/48; H01L 29/46; H01L 29/54
[52] U.S. Cl. .................. 257/306; 257/385; 257/756
[58] Field of Search .......... 357/71; 257/306, 385, 257/754, 756

[56] References Cited

U.S. PATENT DOCUMENTS

| 4,234,889 | 11/1980 | Raymond, Jr. et al. | 357/71 |
| 4,803,534 | 2/1989 | Koike et al. | 357/71 |
| 5,012,310 | 4/1991 | Kimura et al. | 257/306 |
| 5,101,251 | 3/1992 | Wakamiya et al. | 357/23.6 |

FOREIGN PATENT DOCUMENTS

| 0315422 | 10/1989 | European Pat. Off. |   |
| 3922456 | 1/1990 | Fed. Rep. of Germany . |   |
| 4113962 | 11/1991 | Fed. Rep. of Germany . |   |
| 58-142579 | 8/1983 | Japan | 357/71 |
| 63-44743 | 2/1988 | Japan . |   |
| 2-79462 | 3/1990 | Japan . |   |
| 3-26543 | 2/1991 | Japan . |   |

OTHER PUBLICATIONS

Konaka et al., "A 20-ps Si Bipolar IC Using Advanced Superself-Aligned Process Technology with Collector Ion Implantation", *IEEE Transactions on Electron Devices*, vol. 36, No. 7, Jul., 1989, pp. 1370–1375.

Primary Examiner—William Mintel
Assistant Examiner—Robert Limanek
Attorney, Agent, or Firm—Lowe, Price, LeBlanc & Becker

[57] ABSTRACT

A semiconductor device is disclosed that can form contacts with ease even if the distance between adjacent gate electrodes is reduced in accordance with larger scale integration of semiconductor devices. The semiconductor device includes a polysilicon pad 8c connected to impurity implanted layers 5a and 7a, formed over sidewalls 6a and 6b of gate electrodes 3a and 3b and insulating films 4a and 4b; and a polysilicon pad 11a connected to impurity implanted layers 5b and 7b, formed over polysilicon pad 8c with an insulating film 9 and sidewalls 10b therebetween. Even if elements are miniaturized to have reduced gate electrode length and gate electrode distance in accordance with larger scale integration of a semiconductor device, polysilicon pads 8c and 11a can be formed with ease between impurity implanted layers 5a, 7a and an upper layer wiring 13a, and between impurity implanted layers 5b, 7b and an upper layer wiring 13b, respectively. Thus, contact holes 15a and 15b can be formed without difficulty for forming upper layer wirings 13a and 13b, even if semiconductor devices are increased to larger scale integration.

8 Claims, 8 Drawing Sheets

SEMICONDUCTOR DEVICE HAVING CONTACT BETWEEN WIRING LAYER AND IMPURITY REGION

This application is a continuation of application Ser. No. 07/662,000 filed Mar. 1, 1991 now abandoned.

BACKGROUND OF THE INVENTION

1. Field of the Invention

The present invention relates to a semiconductor device, and more particularly, to a semiconductor device applicable to a peripheral circuit of a DRAM (Dynamic Random Access Memory), and a method of manufacturing thereof.

2. Description of the Background Art

In recent years, the demand for semiconductor memory devices are rapidly increasing due to the remarkable spread of information equipment of computers. Semiconductor memory devices having large functional storage capacity and capable of high speed operation are required. Accordingly, developments in techniques are carried out regarding high density integration, quick response, and high reliability of semiconductor memory devices.

A DRAM in semiconductor memory devices is known as being capable of random input/output of storage information. A DRAM usually comprises a memory cell array which is the storage region for storing a plurality of storage information, and a peripheral circuit required for input from and output to an external source. FIG. 3 is a block diagram showing a general DRAM structure. Referring to FIG. 3, a DRAM 50 comprises a memory cell array 51 for storing data signal of storage information, a row-and-column address buffer 52 for receiving external address signals to select memory cells forming a unit storage circuit, a row decoder 53 and a column decoder 54 for specifying a memory cell by decoding the address signal, a sense refresh amplifier 55 for amplifying and reading out the signal stored in the specified memory cell, a data-in buffer 56 and a data-out buffer 57 for data input/output, and a clock generator 58 for generating a clock signal.

The memory cell array 51 occupying a large area on the semiconductor chip has a plurality of memory cells for storing unit storage information arranged in a matrix manner. A memory cell is generally implemented with one MOS transistor and one capacitor connected thereof. This memory cell is well known as a one-transistor one-capacitor type memory cell. Such memory cells are widely used for large capacity DRAMs because of its simple structure contributing to the improvement in integration of the memory cell array.

According to the large storage capacity of DRAMs, high integration is required in memory cell array 51. Row decoder 53 adjacent to memory cell array 51, sense refresh amplifier 55, and column decoder 54 of the peripheral circuit are formed to comply with the dimension of memory cell array 51. Therefore, larger scale integration is required in the above mentioned row decoder 53 and the like according to the increased scale of integration of memory cell array 51. Great increase in integration density is not required for row-and-column address buffer 52 of the peripheral circuit which is not adjacent to memory cell array 51, even if memory cell array 51 is increased in integration density.

FIG. 4 is a sectional view showing a contact structure of a row decoder forming a peripheral circuit of a conventional DRAM. Referring to FIG. 4, a row decoder 53 forming a peripheral circuit of a DRAM comprises a semiconductor substrate 1; element isolation regions 2a and 2b for isolating elements formed on semiconductor substrate 1; impurity implanted layers 5a, 7a and 5b, 7b formed in the region enclosed by element isolation regions 2a and 2b with a predetermined distance therebetween; gate electrodes 3a and 3c formed directly on element isolation regions 2a and 2b, respectively; a gate electrode 3b formed between impurity implanted layers 5a, 7a and 5b and 7b with a gate insulating film 14 thereunder; sidewalls 6a, 6b, and 6c formed at the sidewalls of gate electrodes 3a, 3b and 3c; insulating films 4a, 4b and 4c formed over gate electrodes 3a, 3b and 3c, respectively; a polysilicon pad 8a of electrode material connected to impurity implanted layers 5a and 7a, and formed at the sides of and over gate electrodes 3a and 3b with sidewalls 6a and 6b and insulating films 4a and 4b therebetween; a polysilicon pad 8b connected to impurity implanted layers 5b and 7b, and formed at the sidewalls of and over gate electrodes 3b and 3c with sidewalls 6b and 6c and insulating films 4b and 4c therebetween; an interlayer insulating film 12 formed all over semiconductor substrate 1 with contact holes 15a and 15b formed above polysilicon pads 8a and 8b, respectively; an upper layer wiring 13a formed on interlayer insulating film 12 and within contact hole 15a to contact polysilicon pad 8a; and an upper layer wiring 13b formed on interlayer insulating film 12 and within contact hole 15b to contact polysilicon pad 8b.

Row decoder 53 implementing the peripheral circuit of a conventional DRAM is provided with polysilicon pads 8a and 8b between upper layer wirings 13a and 13b and impurity implanted layers 5a, 7a, and 5b, 7b, respectively. The formation of polysilicon pads 8a and 8b simplifies the process of forming upper layer wirings 13a and 13b to solve difficulties encountered in the manufacturing process.

If polysilicon pads 8a and 8b are not provided, it is necessary to contact upper layer wirings 13a and 13b directly to impurity implanted layers 7a and 7b, respectively. The surface area of the connecting region between impurity implanted layers 7a and 7b and upper layer wirings 13a and 13b are reduced in accordance with the scale of element integration increased. The magnitude of contact holes 15a and 15b that can be formed in interlayer insulating film 12 is limited due to manufacturing techniques. It is difficult to form contact holes 15a and 15b smaller than a certain dimension. If the area of the above-mentioned connecting region becomes smaller than the most minimum contact holes 15a and 15b allowable under the manufacturing technology, it is difficult to form contact holes 15a and 15b through to the surface of the connecting regions. This also results in difficulty in forming upper layer wirings 13a and 13b. This problem is overcome by forming polysilicon pads 8a and 8b between upper layer wirings 13a and 13b and impurity implanted layers 7a and 7b, respectively, to assist the formation of contact holes 15a and 15b above polysilicon pads 8a and 8b, whereby upper layer wirings 13a and 13b can be formed with ease. Polysilicon pads 8a and 8b are indispensable where elements are highly integrated to reduce the surface area of the connecting region between upper layer wirings 13a and 13b and impurity implanted layers 7a and 7b.

FIGS. 5A-5F are sectional views of the structure of the row decoder of the DRAM of FIG. 4 for explaining the manufacturing process.

Referring to FIG. 5A, element isolation regions 2a and 2b are selectively formed on semiconductor substrate 1. Referring to FIG. 5B, gate insulating film 14 is formed by thermal oxidation. An electrode material 3 such as of polysilicon doped with impurities is deposited on gate insulating film 14. Insulating film 4 such as of silicon oxide film is deposited over electrode material 3. Electrode material 3 and insulating film 4 are removed by photolithography and etching, leaving only the portion where gate electrodes 3a, 3b and 3c are formed. Ions having a conductivity type opposite to that of semiconductor substrate 1 are implanted into semiconductor substrate 1 to form impurity implanted layers 5a and 5b. Referring to FIG. 5d, an insulating film (not shown) such as of silicon oxide film is deposited all over semiconductor substrate 1 and etched back to form sidewalls 6a, 6b and 6c. Then, ions of a conductivity type opposite to that of semiconductor substrate 1 are implanted between the adjacent gate electrodes on semiconductor substrate 1 to form impurity implanted layers 7a and 7b. Referring to FIG. 5E, a material 8 having conductivity is formed over impurity implanted layers 5a, 7a and 5b, 7b. Referring to FIG. 5F, polysilicon pads 8a and 8b are formed by patterning material 8 having conductivity. Interlayer insulating film 12 is deposited all over the surface, and contact holes 15a and 15b are formed. Lastly, upper layer wirings 13a and 13b are formed above interlayer insulating film 12 and within contact holes 15a and 15b, as shown in FIG. 4.

As mentioned in the foregoing, the row decoder forming the peripheral circuit of a conventional DRAM is provided with polysilicon pads 8a and 8b between upper layer wirings 13a and 13b and impurity implanted layers 5a, 7a, and 5b, 7b to ease the formation of upper layer wirings 13a and 13b. High integration is required for row decoders according to the scale of integration increased in DRAMs. Therefore, elements implementing a row decoder are miniaturized to shorten the length of the gate electrode itself and the distance between adjacent gate electrodes. This causes an inconvenience that the conventional manner of photolithographing and etching polysilicon pads 8a and 8b above gate electrode 3b becomes difficult to carry out. The miniaturization of elements led to a problem that polysilicon pads can be formed only with difficulty. Even if polysilicon pads could be formed in cases where elements are miniaturized, it was difficult to accurately form the upper layer wirings on the polysilicon pads, resulting in the following inconvenience. That is to say, there was possibility of the upper layer wiring and the gate electrode being short-circuited due to one portion of the upper layer wiring formed directly on the gate electrode. There was also an inconvenience that it was necessary to reduce the contact inside diameter of the contact hole when silicon pads can not be formed. This resulted in difficulty in performing photolithography and etching for forming contact holes.

In conventional DRAMs, it was difficult to form a polysilicon pad as a conductive layer between a wiring layer and an impurity region, whereby contacts could not be formed with ease when elements are miniaturized according to larger scale integration of semiconductor device with reduced distance between adjacent gate electrodes.

SUMMARY OF THE INVENTION

An object of the present invention is to facilitate formation of contacts even when the distance between adjacent gate electrodes is reduced in accordance with increase in scale of integration in a semiconductor device.

Another object of the present invention is to interpose a conductive layer between an impurity region and a wiring layer even when the distance between adjacent gate electrodes are reduced in accordance with increase in scale of integration in a semiconductor device.

A further object of the present invention is to form a contact with ease without complicating the manufacturing process even when the distance between adjacent gate electrodes is reduced in accordance with increase in the scale of integration in a method of manufacturing a semiconductor device.

A still further object of the present invention is to form a conductive layer with ease without using new techniques between an impurity region and a wiring layer even when the distance between adjacent gate electrodes are reduced in accordance with increase in the scale of integration in a method of manufacturing a semiconductor device.

According to an aspect of the present invention, a semiconductor device includes a semiconductor substrate, a pair of impurity regions, gate electrodes, a first conductive layer, a second conductive layer, a first wiring layer and a second wiring layer. One pair of impurity regions are formed on the semiconductor substrate with a predetermined distance therebetween. A gate electrode is formed between one pair of impurity regions with a gate insulating film thereunder. The first conductive layer is connected to one of the impurity regions, and formed at the sidewalls of and over the gate electrode with a first insulating film therebetween. The second conductive layer is connected to the other of the impurity regions, and is formed having at least the end thereof above the conductive layer with a second insulating film therebetween. The first wiring layer is connected to the first conductive layer. The second wiring layer is connected to the second conductive layer.

In operation, a conductive layer is formed between the impurity regions and the wiring layers even when the distance between adjacent gate electrodes is reduced, due to the first conductive layer formed at the sidewalls of and over the gate electrode with the first insulating film therebetween, and the second conductive layer formed having at least the end thereof formed on the first conductive layer with the second insulating film therebetween.

According to another aspect of the present invention, a semiconductor device includes a semiconductor substrate of a first conductivity type, impurity regions of a second conductivity type, a plurality of gate electrodes, a first conductive layer, a second conductive layer, a first wiring layer, and a second wiring layer. At least two of the impurity regions of the second conductivity type are formed having a predetermined distance between the element isolation regions on the semiconductor substrate of the first conductivity type. The plurality of gate electrodes are formed on the element isolation regions, and between the impurity regions on the semiconductor substrate with a gate insulating film thereunder. The first conductive layer is connected to one of the impurity regions of the impurity regions of the second conductivity type, and formed at the sidewalls of and over the gate electrode with the first insulating film therebetween. The second conductivity layer is connected to the other of the impurity regions of the second conductivity type, and formed having at least the end thereof formed above the first conductive layer with the second insulating film therebetween. The first and second wiring layers are connected to the first and second conductive layers, respectively.

In operation, a conductive layer is formed with ease between the impurity regions and the wiring layers even when the distance between adjacent gate electrodes is reduced, due to the first conductive layer formed at the sidewalls of and above the gate electrode with the first insulating film therebetween, and the second conductive layer having at least the end thereof formed above the first conductive layer with the second insulating film therebetween.

According to a further aspect of the present invention, a method of manufacturing a semiconductor device comprises the step of forming gate electrodes on a semiconductor substrate with an insulating film therebetween. A first sidewall insulating film is formed at the sidewalls of the gate electrode by forming and etching a first insulating film on the semiconductor substrate and the gate electrode. One pair of impurity regions are formed by ion-implantation of impurities using the first sidewall insulating film as a mask. A first conductive layer and a second insulating film are formed on one of the impurity regions and the first sidewall insulating film, and patterned to a predetermined configuration. By forming a third insulating film all over the semiconductor substrate and applying anisotropic etching, a second sidewall insulating film is formed at the sidewalls of the first conductive layer and the second insulating film. A second conductive layer is formed above the other of the impurity regions, the second sidewall insulating film, and the second insulating film. After a fourth insulating film is formed all over the surface, first and second openings having a predetermined dimension are formed at a position on the first and second conductive layers, respectively, in the fourth insulating film. First and second wiring layers are formed in the first and second openings to contact first and second conductive layers, respectively.

In operation, first and second conductive layers overlying each other with an insulating film therebetween are formed with ease without complicating the manufacturing process, by forming and etching anisotropicaly a third insulating film all over the semiconductor substrate to form a second sidewall insulating film at the sidewalls of the first conductive layer and the second insulating film, and to form a second conductive layer on the other of the impurity regions, the second sidewall insulating film, and the second insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
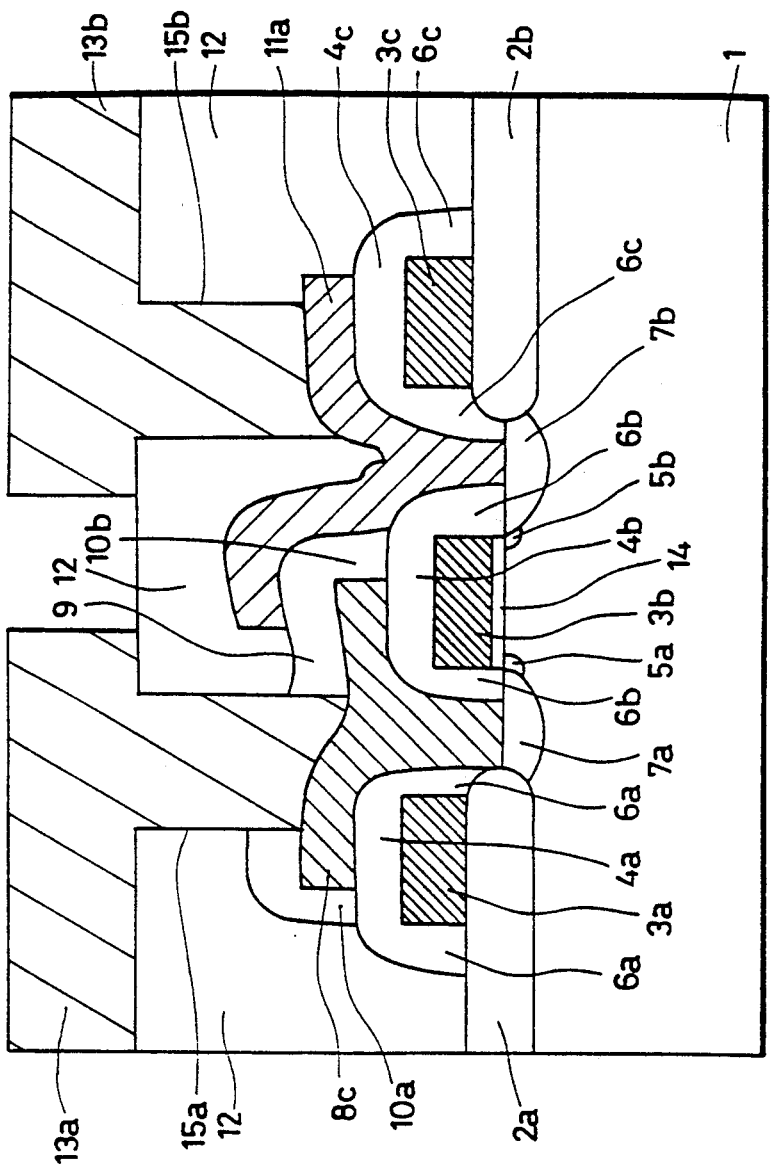
FIG. 1 is a sectional view of a contact structure of a row decoder of a DRAM according to an embodiment of the present invention.

Referring to FIG. 1, a row decoder implementing a peripheral circuit of a DRAM comprises a semiconductor substrate 1; element isolation regions 2a and 2b for isolating elements formed on semiconductor substrate 1; impurity implanted layers 5a, 7a and 5b, 7b formed in a region enclosed by element isolating regions 2a and 2b on semiconductor substrate 1 with a predetermined distance therebetween; gate electrodes 3a and 3c formed directly on element isolation regions 2a and 2b, respectively; a gate electrode 3b formed between impurity implanted layers 5a, 7a and 5b, 7b with a gate insulating film 14 thereunder; sidewalls 6a, 6b and 6c formed at the sidewalls of gate electrodes 3a, 3b and 3c, respectively; insulating films 4a, 4b and 4c formed on gate electrodes 3a, 3b and 3c, respectively; a polysilicon pad 8c connected to impurity implanted layers 5a and 7a and formed at sidewalls 6a and 6b of gate electrodes 3a and 3b and on insulating films 4a and 4b; sidewalls 10a and 10b formed at the sidewalls of polysilicon pad 8c; an insulating film 9 formed on polysilicon pad 8c; a polysilicon pad 11a connected to impurity implanted layers 5b and 7b, and formed at sidewalls 6b and 6c of gate electrodes 3b and 3c and on insulating films 4b and 4c, and above polysilicon pad 8c with insulating film 9 and sidewall 10b therebetween; a contact hole 15a formed in insulating film 9 and interlayer insulating film 12 on polysilicon pad 8c; a contact hole 15b formed in insulating film 12 on polysilicon pad 11a; an upper layer wiring 13a formed above contact hole 15a and insulating film 12 to contact polysilicon pad 8c; and an upper layer wiring 13b formed above contact hole 15b and insulating film 12 to contact polysilicon pad 11a.

The present embodiment has a layered structure of polysilicon pad 8c and polysilicon pad 11a. This allows the formation of polysilicon pads 8c and 11a between impurity implanted layers 5a, 7a and upper layer wiring layer 13a, and impurity implanted layers 5b, 7b and upper layer wiring layer 13b, respectively, without difficulty in manufacturing, even if elements forming a row decoder are miniaturized in accordance with increase in the scale of integration of the DRAM to reduce the gate electrode length and the gate electrode distances. This eases the formation of contact holes 15a and 15b for forming upper layer wirings 13a and 13b. In other words, strict dimension precision of contact holes 15a and 15b is not required even if the row decoder is of larger scale integration and the elements miniaturized. Furthermore, the inside diameter of contact holes 15a and 15b may be increased. Thus, difficulty encountered in manufacturing at the contact according to miniaturization of elements can be solved to produce high yields at the time of manufacturing.

Figure 2A:
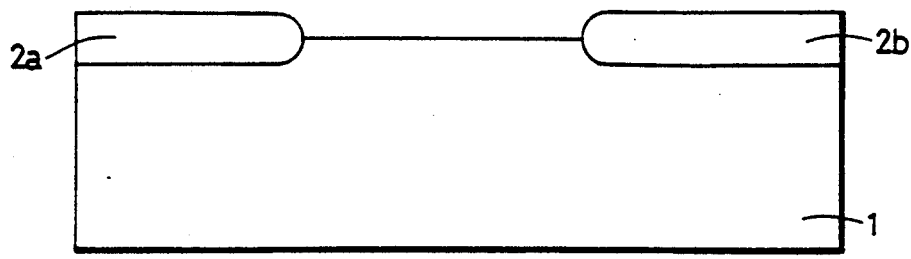
FIGS. 2A-2I are sectional structure views of the contact of the row decoder of the DRAM of FIG. 1 for explaining the manufacturing process.
Figure 2B:
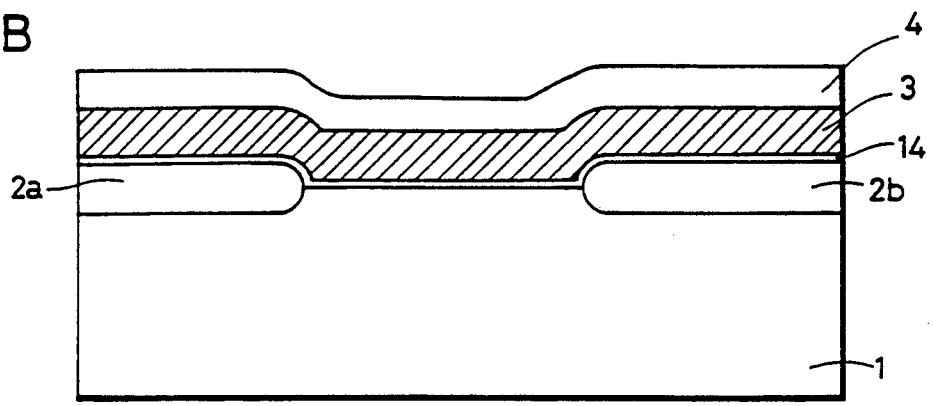

The manufacturing process of the contact structure of the row decoder of the DRAM of FIG. 1 will be explained hereinafter with reference to FIGS. 2A-2I. Referring to FIG. 2A, element isolation regions 2a and 2b are selectively formed on semiconductor substrate 1. Referring to FIG. 2B, gate insulating film 14 is formed all over the surface by thermal oxidation. Electrode material 3 such as of polysilicon having impurities doped is formed on gate insulating film 14. Insulating film 4 such as of silicon oxide film is formed on electrode material 3.

Figure 2C:
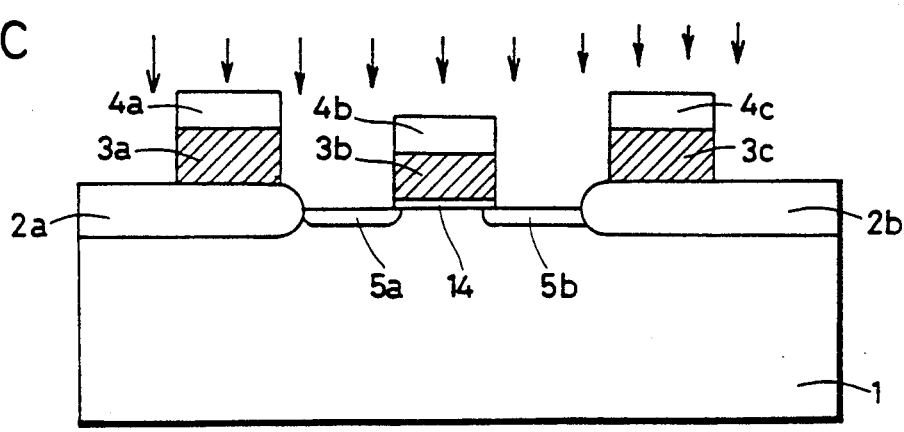

Referring to FIG. 2C, the regions of electrode material 3 and insulating film 4 are removed by patterning using photolithography techniques and etching techniques, leaving only the regions where gate electrodes 3a, 3b and 3c are formed. This results in insulating films 4a, 4b and 4c formed on gate electrodes 3a, 3b and 3c, respectively. Ions of a conductivity type opposite to that of semiconductor substrate 1 are implanted into semiconductor substrate 1 using gate electrode 3b and insulating film 4b as a mask, to form impurity implanted layers 5a and 5b.

Figure 2D:
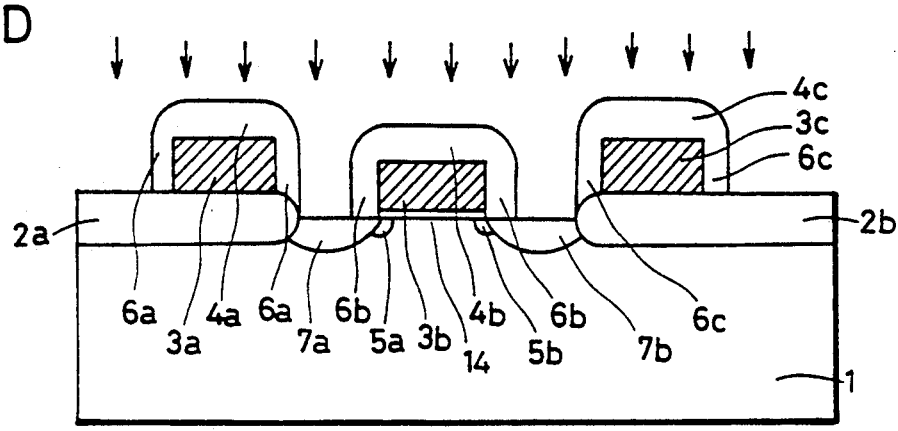

Referring to FIG. 2D, an insulating film (not shown) such as of silicon oxide film is formed all over the surface of semiconductor substrate 1. By etching back this insulating film, sidewalls 6a, 6b and 6c are formed at the sidewalls of gate electrodes 3a, 3b and 3c, respectively. Using sidewalls 6a, 6b and 6c as a mask, ions of a conductivity type opposite to that of semiconductor substrate 1 are implanted, to form impurity implanted layers 7a and 7b.

Figure 2E:
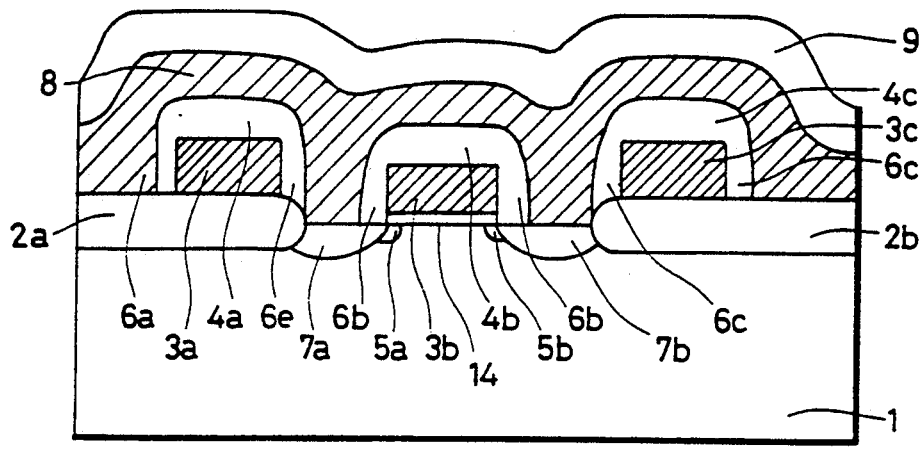
Figure 2F:
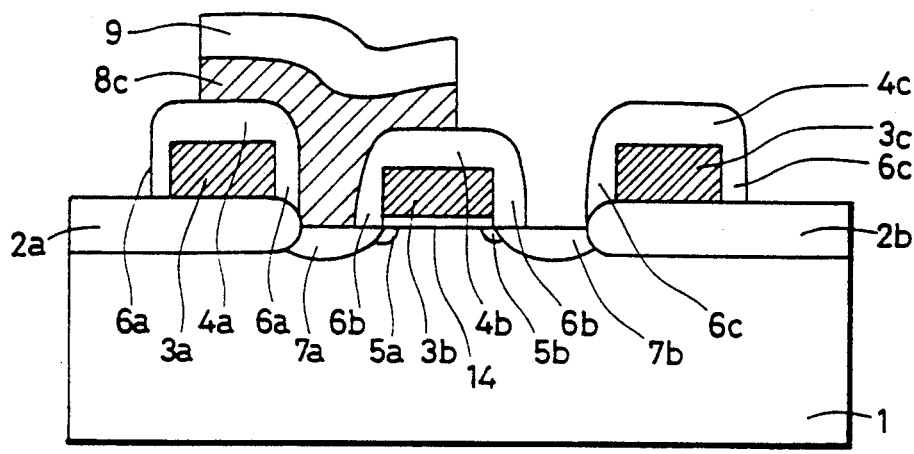

Referring to FIG. 2E, material 8 such as of polysilicon having conductivity is formed all over the surface, followed by formation of insulating film 9 such as of silicon oxide film. Referring to FIG. 2F, polysilicon pad 8c is formed to connect impurity implanted layers 5a and 7a and to extend over gate electrodes 3a and 3b using photolithography techniques and etching techniques.

Figure 2G:
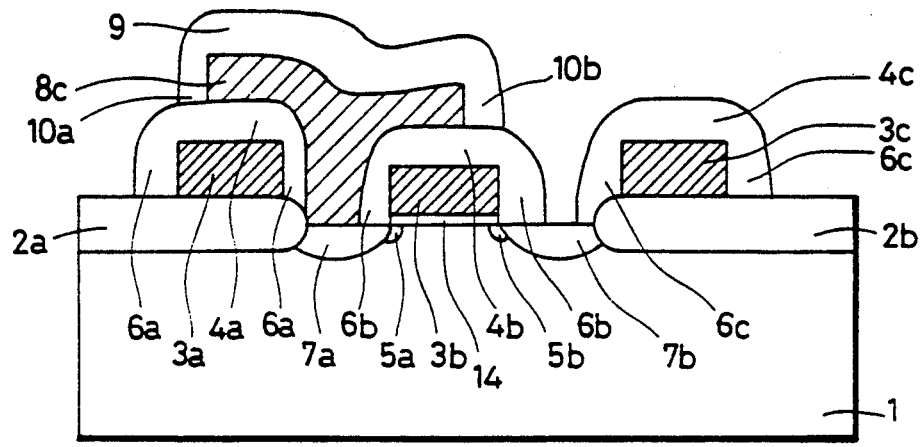
Figure 2H:
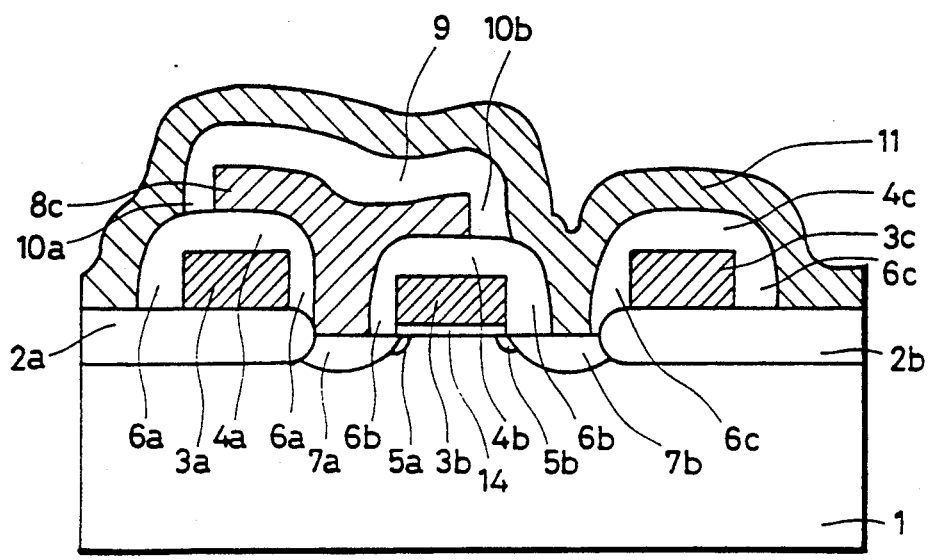
Figure 2I:
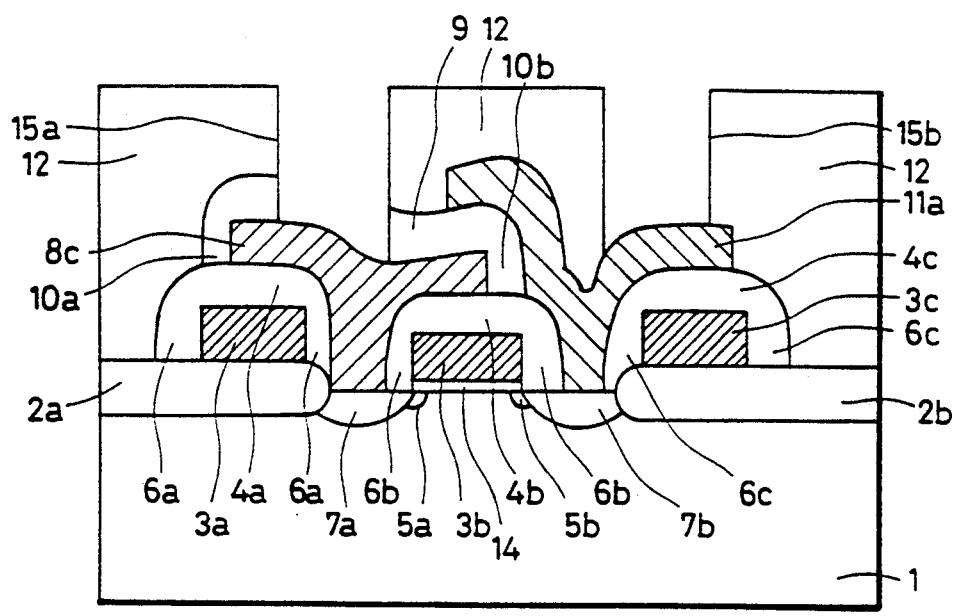
Figure 3:
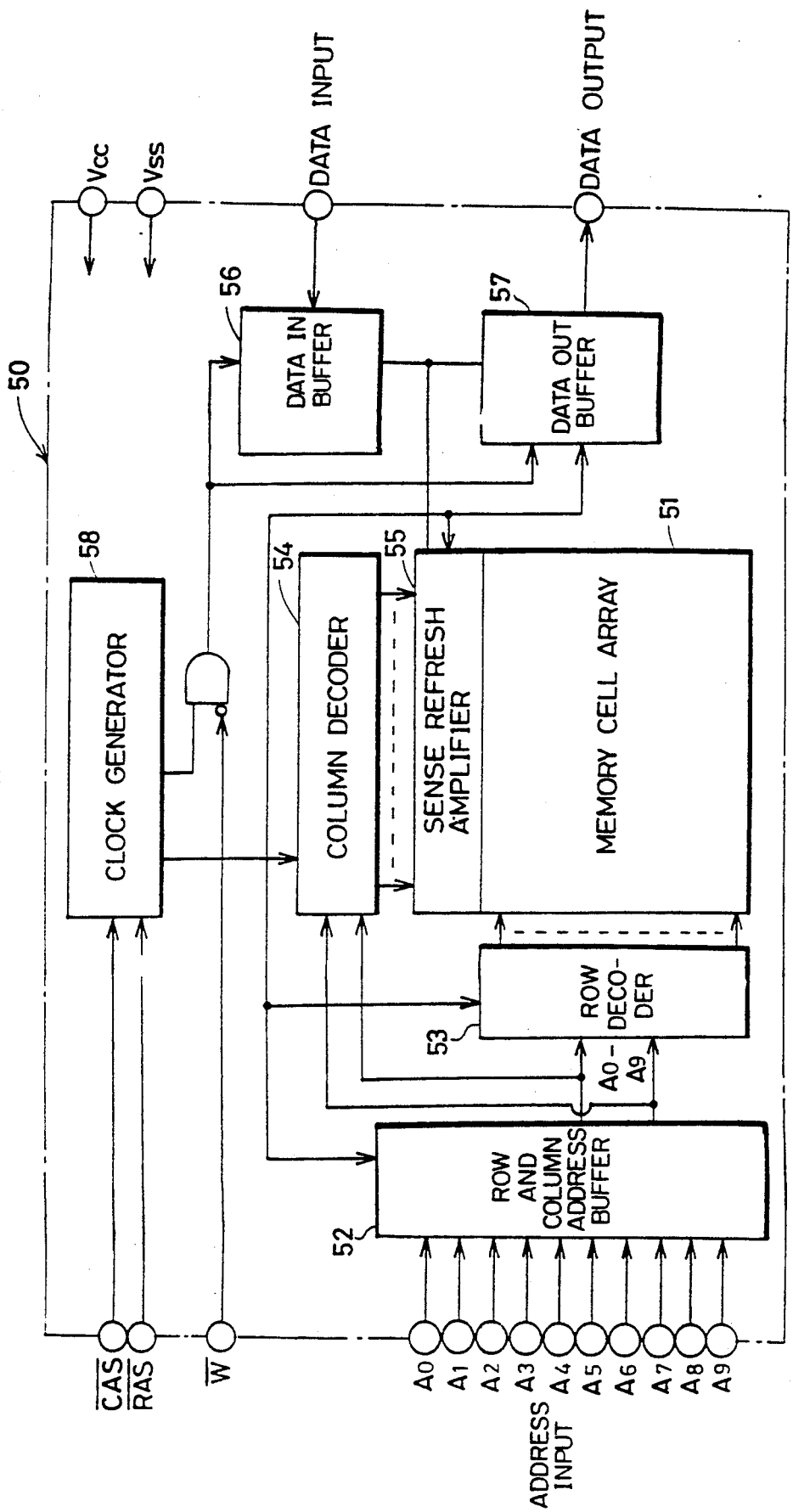
FIG. 3 is a block diagram of a structure of a conventional DRAM.
Figure 4:
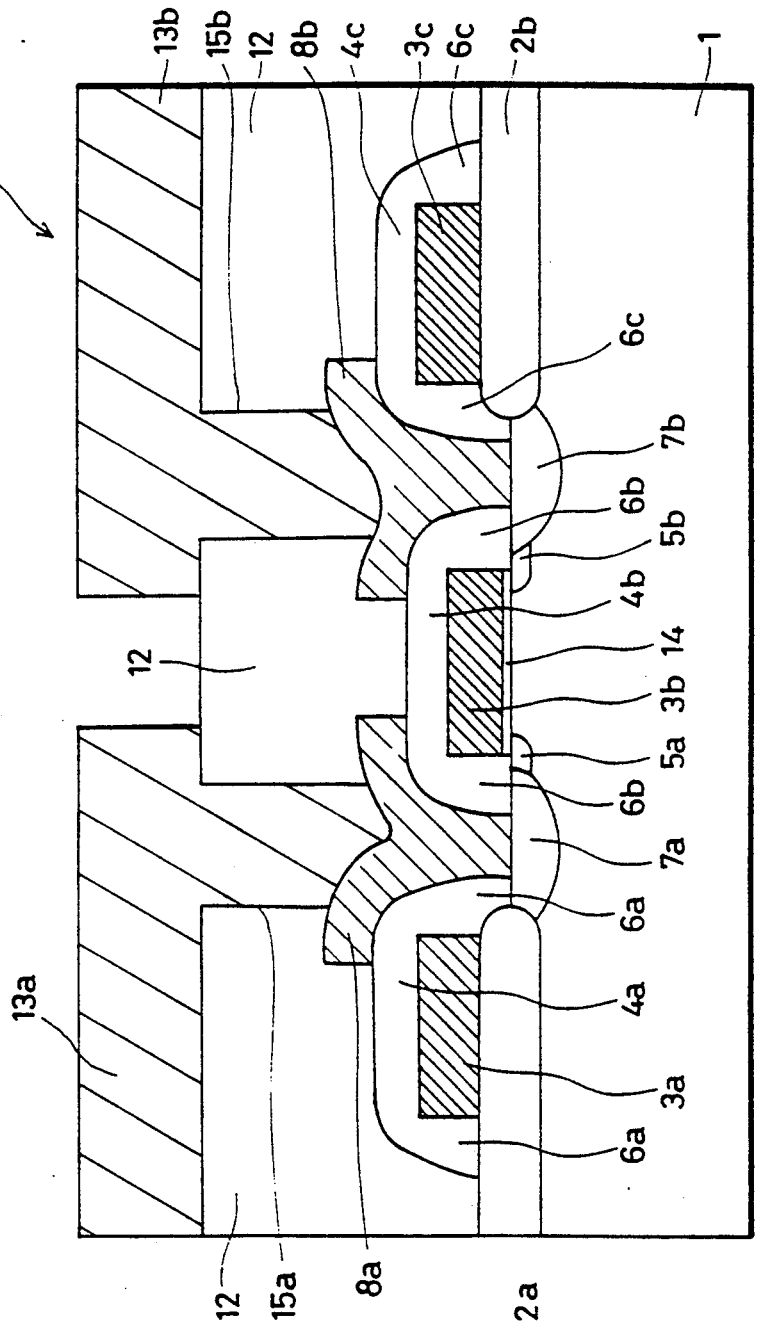
FIG. 4 is a sectional view of a contact in a row decoder of a conventional DRAM.
Figure 5A:
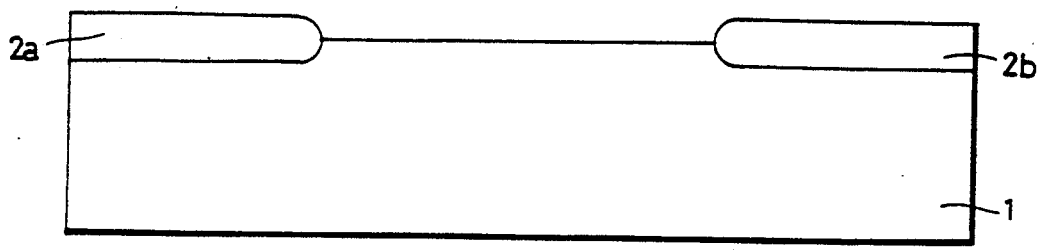
FIGS. 5A-5F are sectional structure views of the row decoder of the DRAM of FIG. 4 for explaining the manufacturing process.
Figure 5B:
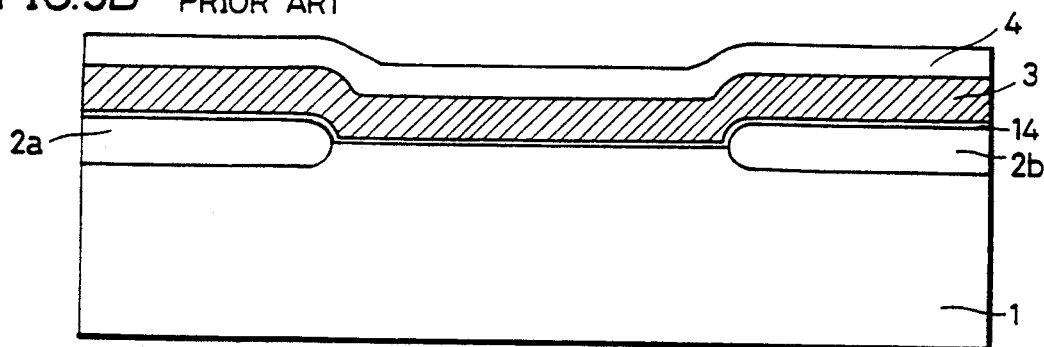
Figure 5C:
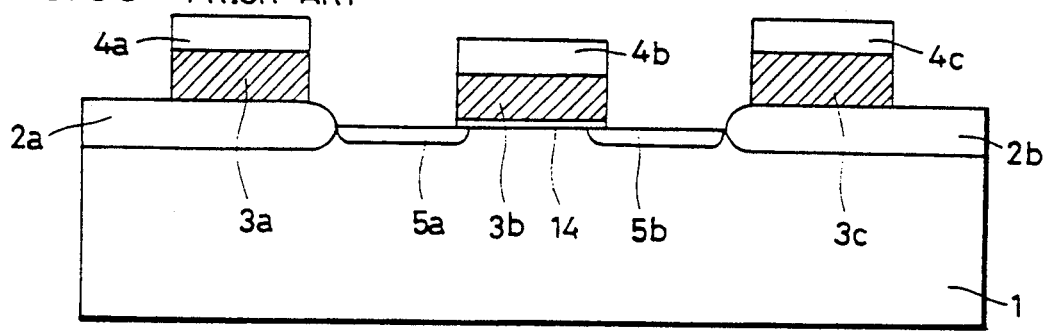
Figure 5D:
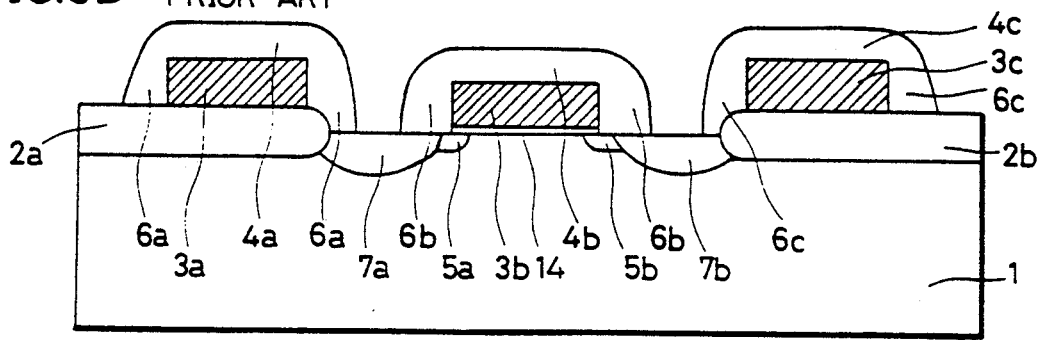
Figure 5E:
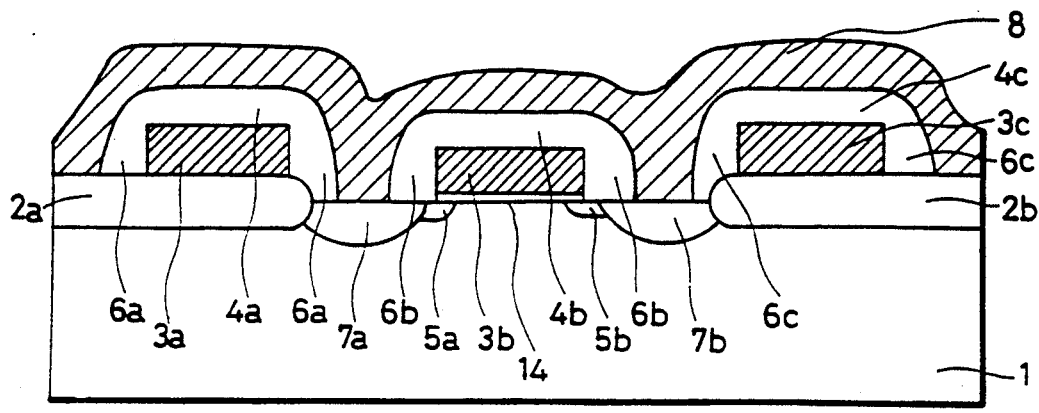
Figure 5F:
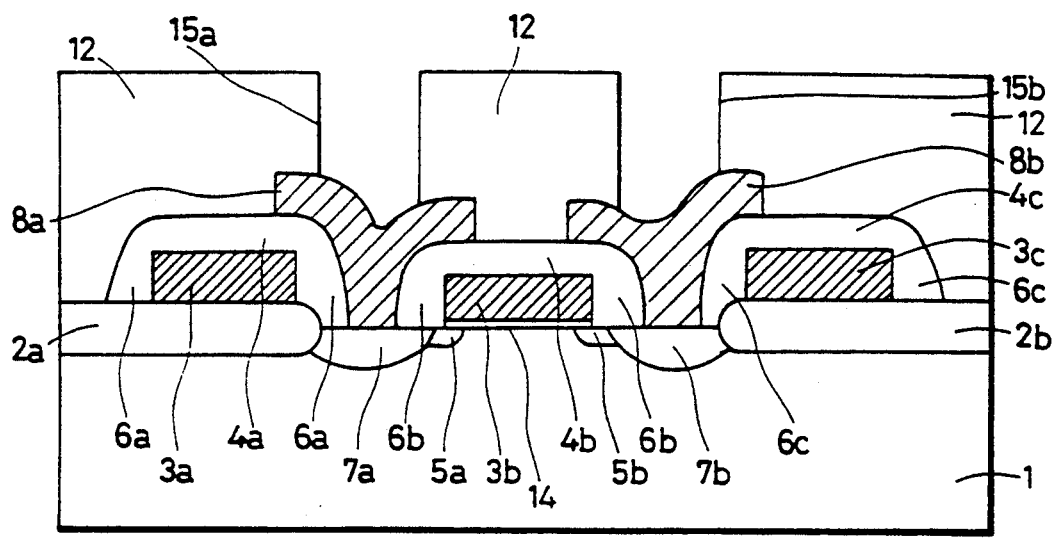

Referring to FIG. 2G, sidewalls 10a and 10b are formed at the sidewalls of polysilicon pad 8c by forming an insulating film (not shown) such as of silicon oxide film all over the surface and etching it. Referring to FIG. 2H, a conductive material 11 such as of polysilicon is formed on the entire surface. Referring to FIG. 2I, polysilicon pad 11a is formed by means of photolithography and etching techniques. Polysilicon pad 11a is formed to connect impurity implanted layers 5b and 7b, to extend over gate electrodes 3b and 3c, and to extend above polysilicon pad 8c with insulating film 9 therebetween. After interlayer insulating film 12 is formed on the entire surface, contact holes 15a and 15b are formed in interlayer insulating film 12 above polysilicon pads 8c and 11a, respectively.

Then, upper layer wirings 13a and 13b are formed at contact holes 15a and 15b as shown in FIG. 1. Hence, impurity implanted layers 5a and 7a are electrically connected to upper layer wiring 13a by polysilicon pad 8c. Also, impurity implanted layers 5b and 7b are connected to upper layer wiring 13b by polysilicon pad 11a. In accordance with the present embodiment, polysilicon pad 8c and polysilicon pad 11a overlying each other with insulating film 9 therebetween can be formed easily without using new manufacturing techniques. Even if row decoders are highly integrated according to increase in the scale of integration of DRAMs to miniaturize elements, resulting in reduced gate electrode length and gate electrode distance, polysilicon pads 8c and 11a can be formed with ease. This will simplify the process of forming upper layer wirings 13a and 13b without complicating the manufacturing process.

The present invention is not limited to the present embodiment where a row decoder implementing a peripheral circuit of a DRAM is described. Similar effects can be obtained by applying the present invention to where larger scale integration is required in peripheral circuitry, such as to column decoders and sense refresh amplifiers. The present invention is also applicable to memory cells.

Although polysilicon pads are formed as a method of contacting the impurity implanted layers and the upper layer wirings in the present embodiment, the present invention is not limited to this and can be applied to contact between lower wirings and upper wirings. Although the present invention has been described using a polysilicon having impurities doped as the material of the gate electrode, this is only by way of example, and refactory metal silicide layers, refactory metal polycides, or refactory metals may be used. A polysilicon pad such as of polysilicon which has been described as an example of the electrode material is only by way of example, and any material having conductivity may be used.

According to a concept of a semiconductor device of the present invention, a first conductive layer is formed at the sidewalls of and over gate electrodes with a first insulating film therebetween. A second conductive layer is formed having at least the end thereof on the first conductive layer with a second insulating film therebetween. A conductive layer can be formed between impurity regions and wiring layers even when the distance between adjacent gate electrodes are small. As a result, contacts can be formed with ease even when the distance between gate electrodes are reduced in accordance with larger scale integration of a semiconductor device.

According to another concept of a semiconductor device of the present invention, a first conductive layer is formed to connect at least one of two impurity regions of a second conductivity type at the sidewalls of and over gate electrodes with a first insulating film therebetween. A second conductive layer is formed to contact the other of the two impurity regions of the second conductivity type, having at least the end thereof on the first conductive layer with a second insulating film therebetween. Even if the distance between adjacent gate electrodes are small, a conductive layer can be formed with ease between the impurity regions and the wiring layers. It is therefore easy to form contacts even if elements are miniaturized to be reduced in distance between gate electrodes in accordance with larger scale integration of semiconductor devices.

According to a further concept of the present invention, a method of manufacturing a semiconductor device comprises the steps of forming gate electrodes on a semiconductor substrate with an insulating film thereunder, followed by forming a first sidewall insulating film at the sidewalls thereof. A pair of impurity regions are formed using the first sidewall insulating film as a mask. A first conductive layer and a second insulating are formed above one of the impurity regions and the first sidewall insulating film to be patterned. Then a third insulating film is formed all over the surface of the semiconductor substrate. A second sidewall insulating film is formed at the sidewalls of the first conductive layer and the second insulating film by means of anisotropic etching. A second conductive layer is formed over the other impurity regions, the second sidewall insulating film, and the second insulating film. Thus, a conductive layer can be formed with ease between the impurity regions and the wiring layers without using new techniques, even if the distance between adjacent gate electrodes are small. Therefore, contacts can be formed with ease without complicating the manufacturing process even if the distance between gate electrodes is reduced in accordance with larger scale integration of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of a first conductivity type,
    at least two impurity regions of a second conductivity type formed between first and second element isolation regions on said semiconductor substrate of the first conductivity type with a predetermined distance therebetween,
    first and second gate electrodes formed on said first and second element isolation regions,
    a third gate electrode formed between said impurity regions on said semiconductor substrate with a gate insulating film thereunder,
    a first pad layer connected to one of said impurity regions of a second conductivity type, and formed at the sidewalls of and over said first and third gate electrodes, one end of said first pad layer being positioned within a region over only a portion of said first gate electrode and a second end of said first pad layer being positioned within a region over only a portion of said third gate electrode,
    a second pad layer connected to the other of said impurity regions of the second conductivity type, and formed having at least a first end thereof over said first pad layer, said first end of said second pad layer being positioned within a region over only a portion of said third gate electrode and a second end of said second pad layer being positioned within a region over only a portion of said second gate electrode,
    a first insulating film between said pad layers and said gate electrodes,
    a second insulating film overlying the top and on opposite sidewalls of said first pad layer, said second insulating film insulating said first and second pad layers from each other,
    a first wiring layer connected to said first pad layer; and
    a second wiring layer connected to said second pad layer,
    wherein said second end of said first pad layer and said first end of said second pad layer overlap each other above said third gate electrode formed between said impurity regions with said second insulating film therebetween.

2. The semiconductor device according to claim 1, wherein said first insulating film comprises
    a first upper insulating film formed on said first, second and third gate electrodes, and
    a first sidewall insulating film formed at the sidewalls of said first, second and third gate electrodes and said first upper insulating film.

3. The semiconductor device of claim 1, wherein said second insulating film comprises a sidewall insulating film formed to have the bottom thereof connected to said first insulating film.

4. The semiconductor device of claim 1, wherein an upper end of at least one of said first and second pad layers have a predetermined lateral width; and
    the diameter of at least one of said wiring layers at a portion thereof connecting to a corresponding first or second pad layer is less than said predetermined width.

5. A semiconductor device as recited in claim 1 wherein said second insulating film ends over said third gate electrode.

6. A semiconductor device as recited in claim 1, wherein said first end of said second pad layer is vertically separated from said semiconductor substrate by said first and second insulating films, and said second end of said second pad layer is vertically separated from said semiconductor substrate only by said first insulating film.

7. A semiconductor device as recited in claim 1 wherein said first insulating film overlies each of said first, second and third gate electrodes, and said second insulating film overlies only said first and third gate electrodes,
    said first end of said second pad layer overlies said first and second insulating films and said third gate electrode, and
    said second end of said second pad layer overlies said first insulating film and said second gate electrode.

8. A semiconductor device as recited in claim 1 wherein said second insulating film comprises a vertical portion on said first insulating film, said first end of said second pad layer is vertically separated from said semiconductor substrate by said first insulating film and said vertical portion of said second insulating film and said second end of said second pad layer is vertically separated from said semiconductor substrate only by said first insulating film.

* * * * *